US012672247B2

(12) United States Patent
Ding et al.

(10) Patent No.: US 12,672,247 B2
(45) Date of Patent: Jun. 30, 2026

(54) DISPLAY SUBSTRATE AND DISPLAY DEVICE

(71) Applicants: Hefei BOE Joint Technology Co., Ltd., Hefei (CN); BOE Technology Group Co., Ltd., Beijing (CN)

(72) Inventors: Luke Ding, Beijing (CN); Can Yuan, Beijing (CN); Cheng Xu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 147 days.

(21) Appl. No.: 18/696,957

(22) PCT Filed: Jul. 4, 2023

(86) PCT No.: PCT/CN2023/105766
§ 371 (c)(1),
(2) Date: Mar. 28, 2024

(87) PCT Pub. No.: WO2024/017060
PCT Pub. Date: Jan. 25, 2024

(65) Prior Publication Data
US 2024/0397650 A1 Nov. 28, 2024

(30) Foreign Application Priority Data

Jul. 22, 2022 (CN) .......................... 202210871553.9

(51) Int. Cl.
*H05K 5/02* (2006.01)
(52) U.S. Cl.
CPC .................................. *H05K 5/0247* (2013.01)

(58) Field of Classification Search
None
See application file for complete search history.

(56) References Cited

U.S. PATENT DOCUMENTS

| | | | |
|---|---|---|---|
| 11,211,443 B2 | 12/2021 | Lee et al. | |
| 2017/0288008 A1* | 10/2017 | Kim | H10K 59/1315 |
| 2021/0375202 A1 | 12/2021 | Huang et al. | |
| 2021/0399079 A1* | 12/2021 | Yan | H10K 59/40 |
| 2022/0057910 A1* | 2/2022 | Xiong | H05K 1/147 |
| 2022/0123088 A1* | 4/2022 | Shi | G09G 3/3225 |

(Continued)

FOREIGN PATENT DOCUMENTS

| | | |
|---|---|---|
| CN | 1820295 A | 8/2006 |
| CN | 104221072 B | 9/2016 |

(Continued)

OTHER PUBLICATIONS

CN 202210871553.9 first office action dated Jul. 23, 2024.

*Primary Examiner* — Xanthia C Relford
(74) *Attorney, Agent, or Firm* — IPro, PLLC

(57) ABSTRACT

The present disclosure provides a display substrate and a display device. The display substrate includes: a base substrate including a display area and a first frame area located on one side of the display area; and a first power bus at least located in the first frame area. The first power bus includes a first sub-bus, a second sub-bus and at least two connecting wires. The first sub-bus is located between the second sub-bus and the display area, and the first sub-bus is electrically connected to the second sub-bus by means of the at least two connecting wires.

15 Claims, 3 Drawing Sheets

(56) References Cited

U.S. PATENT DOCUMENTS

| | | | | |
|---|---|---|---|---|
| 2022/0199652 A1* | 6/2022 | Shang | ................... | H10K 59/131 |
| 2022/0199738 A1* | 6/2022 | Han | ..................... | H10K 59/131 |

FOREIGN PATENT DOCUMENTS

| | | | | |
|---|---|---|---|---|
| CN | 104752485 B | | 6/2018 | |
| CN | 109102771 A | * | 12/2018 | .............. G09G 3/20 |
| CN | 110190103 A | | 8/2019 | |
| CN | 108493226 B | | 4/2021 | |
| CN | 109102771 B | | 2/2022 | |
| CN | 114447030 A | | 5/2022 | |
| CN | 114582923 A | | 6/2022 | |
| CN | 115172428 A | | 10/2022 | |
| JP | 6939445 B2 | | 9/2021 | |
| WO | 2021248489 A1 | | 12/2021 | |
| WO | 2022061543 A1 | | 3/2022 | |

* cited by examiner

DISPLAY SUBSTRATE AND DISPLAY DEVICE

CROSS REFERENCE TO RELATED APPLICATION

This application is a National Stage of International Application No. PCT/CN2023/105766 filed Jul. 4, 2023, which claims priority to Chinese Patent Application No. 202210871553.9, filed with the China National Intellectual Property Administration on Jul. 22, 2022, entitled "DISPLAY SUBSTRATE AND DISPLAY DEVICE", the entire contents of which are incorporated herein by reference.

TECHNICAL FIELD

The present disclosure relates to the field of display technology, in particular to a display substrate and a display device.

BACKGROUND

In recent years, an Organic Light Emitting Diode (OLED) display, as a new type of flat panel display, has gradually received more attention. It has broad application prospect due to its excellent characteristics such as self-luminescence, high luminous brightness, high resolution, wide viewing angle, fast response speed, small thickness, low power consumption, flexibility, wide range of operating temperature, simple structure and manufacturing process.

SUMMARY

Embodiments of the present disclosure provide a display substrate and a display device. The solutions are as follows.

On one hand, a display substrate provided by embodiments of the present disclosure includes:

a base substrate, including a display area, and a first frame area located on one side of the display area; and a first power bus at least located in the first frame area.

The first power bus includes a first sub-bus, a second sub-bus and at least two connecting wires. The first sub-bus is located between the second sub-bus and the display area, and the first sub-bus is electrically connected to the second sub-bus by means of the at least two connecting wires.

In some embodiments, in the above display substrate provided by the embodiments of the present disclosure, the first frame area includes at least one first bonding area for bonding a first circuit board.

The display substrate further includes a general reference line and at least one lead group located in the first frame area, and a second power bus at least located in the first frame area. The lead group is electrically connected to the first circuit board. The lead group includes a first lead, a second lead and a third lead. The first lead is integrated with the first power bus, the second lead is integrated with the second power bus, the third lead is integrated with the general reference line. An orthographic projection of the third lead on the base substrate is located between an orthographic projection of the first lead on the base substrate and an orthographic projection of the second lead on the base substrate.

In some embodiments, in the above display substrate provided by the embodiments of the present disclosure, the first frame area includes a plurality of the first bonding areas arranged abreast, and a spacing area located between the first bonding areas. The lead groups are multiple. Each of the lead groups is electrically connected to one end of the first circuit board adjacent to the spacing area, and the lead group extends in a direction approaching the spacing area.

In some embodiments, in the above display substrate provided by the embodiments of the present disclosure, a distance between the second lead and the spacing area, a distance between the third lead and the spacing area, and a distance between the first lead and the spacing area decrease in sequence.

In some embodiments, the above display substrate provided by the embodiments of the present disclosure further includes a fan-out line located in the first frame area. The fan-out line is connected between the display area and the first circuit board, and the fan-out line is arranged in the same layer with the same material as the second lead.

In some embodiments, the above display substrate provided by the embodiments of the present disclosure further includes a plurality of floating lines arranged in the same layer with the same material as the fan-out line, and the plurality of floating lines are located between the fan-out line and the second lead.

In some embodiments, in the above display substrate provided by the embodiments of the present disclosure, in the direction from the fan-out line to the second lead, line widths and line spaces of the floating lines increase gradually.

In some embodiments, in the above display substrate provided by the embodiments of the present disclosure, the base substrate further includes a second frame area arranged opposite to the first frame area, and a third frame area and a fourth frame area connected to the first frame area and the second frame area respectively. The second frame area includes a second bonding area for bonding the second circuit board.

The first power bus is provided in the first frame area, the second frame area, the third frame area and the fourth frame area. The first power bus in the second frame area is electrically connected to the second circuit board. The first power bus in the third frame area, and the first power bus in the fourth frame area are electrically connected to the first circuit board. The first power buses in the second frame area, the third frame area and the fourth frame area are integrated.

In some embodiments, in the above display substrate provided by the embodiments of the present disclosure, the second power bus is also provided in the second frame area, and the second power bus is electrically connected to the second circuit board.

The display substrate further includes a power line located in the display area. One end of the power line is electrically connected to the second power bus in the first frame area, and the other end of the power line is electrically connected to the second power bus in the second frame area.

In some embodiments, the above display substrate provided by the embodiments of the present disclosure further includes a plurality of fourth leads and a plurality of fifth leads located in the second frame area. The plurality of fourth leads are connected between the first power bus and the second circuit board. The plurality of fifth leads are connected between the second power bus and the second circuit board. Orthographic projections of the fourth leads on the base substrate and orthographic projection of the fifth leads on the base substrate are arranged alternately.

In some embodiments, in the above display substrate provided by the embodiments of the present disclosure, the third frame area and/or the fourth frame area include(s) a third bonding area arranged abreast with the first frame area. The third bonding area is used to bond the third circuit board.

In the third frame area and/or the fourth frame area, the display substrate includes: a main line, a plurality of branch lines, and a plurality of shift registers arranged in cascade. One end of each of the branch lines is electrically connected to a corresponding one of the shift registers, and the other ends of all the branch lines are connected to the third circuit board through the main line.

In some embodiments, the above display substrate provided by the embodiments of the present disclosure further includes two sixth leads. The two sixth leads each has one end integrated with a respective one of two ends of the general reference line, and the other end connected to an end of a respective one of the outermost two first circuit boards away from the spacing area in an arrangement direction of the first bonding areas.

In some embodiments, in the above display substrate provided by the embodiments of the present disclosure, in a direction away from the display area, the first sub-bus, the general reference line, the second power bus, and the second sub-bus are arranged in sequence.

In some embodiments, in the above display substrate provided by the embodiments of the present disclosure, a layer where the second power bus is located is provided between a layer where the general reference line is located and a layer where the first power bus is located.

On the other hand, embodiments of the present disclosure provides a display device, including the above display substrate provided by the embodiments of the present disclosure.

DETAILED DESCRIPTION

Figure 1:
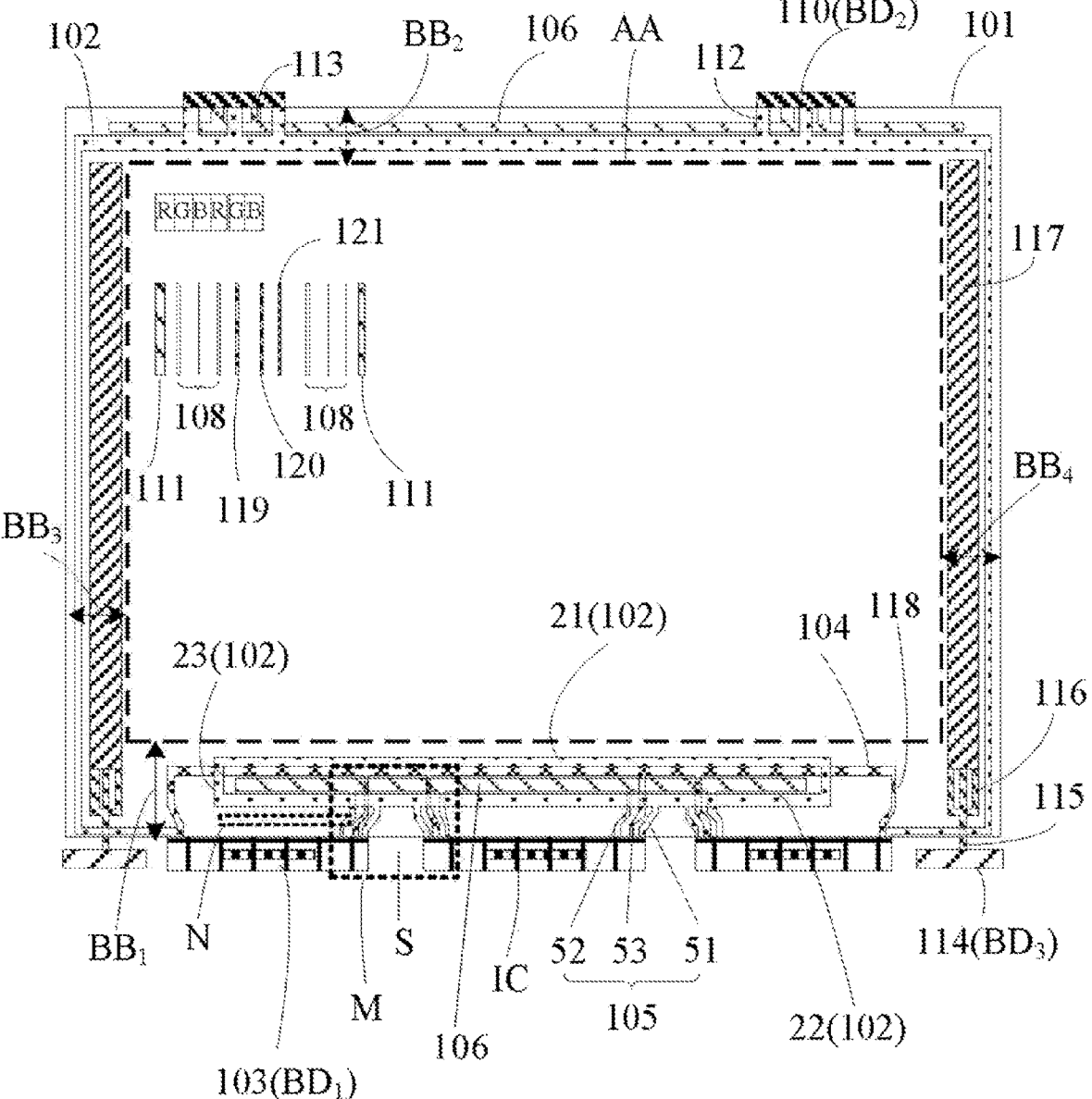
FIG. 1 is a schematic structural diagram of a display substrate provided by embodiments of the present disclosure.

In order to make the purpose, technical solutions and advantages of the embodiments of the present disclosure clearer, the technical solutions of the embodiments of the present disclosure will be clearly and completely described below in conjunction with the drawings of the embodiments of the present disclosure. It should be noted that a size and a shape of each figure in the accompanying drawings do not reflect true scales, and are merely to illustrate contents of the present disclosure. Identical or similar reference numerals denote identical or similar elements or elements having identical or similar functions throughout. In order to keep the following description of the embodiments of the present disclosure clear and concise, in the present disclosure, detailed descriptions of known functions and known components are omitted.

Unless otherwise defined, the technical terms or scientific terms used in the present disclosure shall have the usual meanings understood by those of ordinary skill in art to which the present disclosure belongs. "First", "second" and similar words used in the description and claims of the present disclosure do not indicate any order, quantity or importance, but are only used to distinguish different components. "Comprising" or "including" and similar words mean that the elements or items appearing before the word include the elements or items listed after the word and their equivalents, without excluding other elements or items. "Inside", "outside", "up", "down" and so on are only used to indicate the relative positional relationship. When the absolute position of the described object changes, the relative positional relationship may also change accordingly.

With the upgrading of electronic products, medium-sized OLED display devices have gradually become a hot topic. This is because OLED display devices have advantages such as high contrast and self-illumination, and compared with small-sized screens, medium-sized display screens can provide users with rich information, improve the efficiency of human-machine communication, and bring a better user experience.

To meet the increasingly complex performance requirements of medium-sized OLED display devices, pixel circuits contained in the medium-sized OLED display devices also become more and more complex. For example, 6T1C and similar internal compensation pixel circuits, which can reduce resolution and increase refresh rate, are employed in related technologies. Complex pixel circuits correspond to more manufacturing processes and more stringent process requirements, greatly increasing the probabilities of various defects in the actual product manufacture. In order to ensure the yield, maintenance processes are essential. A power bus can provide power signals for pixel circuits and light-emitting devices to achieve image display, and thus the yield of the power bus is particularly important.

Based on this, embodiments of the present disclosure provide a display substrate, as shown in FIG. 1, including:

a base substrate 101, including a display area AA and a first frame area $BB_1$ located on one side of the display area AA; and a first power bus 102 at least located in the first frame area $BB_1$.

The first power bus 102 includes a first sub-bus 21, a second sub-bus 22 and at least two connecting wires 23. The first sub-bus 21 is located between the second sub-bus 22 and the display area AA. The first sub-bus 21 is electrically connected to the second sub-bus 22 by means of the at least two connecting wires 23. Optionally, the first power bus 102 may be a high-level (VDD) power bus or a low-level (VSS) power bus. In the present disclosure, the case where the first power bus 102 is a low-level power bus is taken as an example for description. The connecting wires 23 may be arranged in parallel between the first sub-bus 21 and the second sub-bus 22, or the connecting wires 23 may be arranged crosswise in a mesh structure and connected between the first sub-bus 21 and the second sub-bus 22.

In the above display substrate provided by the embodiments of the present disclosure, the first power bus 102 is configured as a dual bus structure including a first sub-bus 21 and a second sub-bus 22, and at least two connecting wires 23 are used to connect the first sub-bus 102 and the second sub-bus 22 together, so that when open circuit occurs at the first sub-bus 21, the open-circuited first sub-bus 21 can still maintain normal signal transmission performance through the connecting wires 23 and the second sub-bus 22. When short circuit occurs between the first sub-bus 21 and other component(s) (e.g. the general reference line) due to a metal residue (Particle), the problem of short circuit can be solved by disconnecting the first sub-bus 21 at the position where the metal residue is located from the first sub-bus 21 around the metal residue by means of laser cutting or the like, and the disconnected first sub-bus 21 can still maintain normal signal transmission performance through the connecting wires 23 and the second sub-bus 22. Likewise, when the second sub-bus 22 or the connecting wires 23 are open-circuited or are short-circuited with other components, the signal transmission performance of the first power bus 102 can still be ensured. Therefore, the present disclosure improves the yield of the first power bus 102.

In some embodiments, in the above display substrate provided by the embodiments of the present disclosure, as shown in FIG. 1, the first frame area $BB_1$ includes at least one first bonding area $BD_1$ for bonding a first circuit board 103. Optionally, the first circuit board 103 may be a Chip on Film (COF) with a chip (IC). The display substrate may further include a general reference line 104 and at least one lead group 105 in the first frame area $BB_1$, and a second power bus 106 at least in the first frame area $BB_1$. Optionally, in order to facilitate wiring, the first sub-bus 21, the general reference line 104, the second power bus 106, and the second sub-bus 22 can be arranged in sequence in the direction away from the display area AA. A layer where the second power bus 106 is located (e.g. a second source-drain metal layer $SD_2$) is disposed between a layer where the general reference line 104 is located (e.g. a first source-drain metal layer $SD_1$) and a layer where the first power bus 102 is located (e.g. a layer where an anode is located). The lead group 105 may be electrically connected to the first circuit board 103. The lead group 105 may include a first lead 51, a second lead 52 and a third lead 53. The first lead 51 is integrated with the first power bus 102. The second lead 52 is integrated with the second power bus 106. The third lead 53 is integrated with the general reference line 104. An orthographic projection of the third lead 53 on the base substrate 101 is located between an orthographic projection of the first lead 51 on the base substrate 101 and an orthographic projection of the second lead 52 on the base substrate 101.

Figure 2:
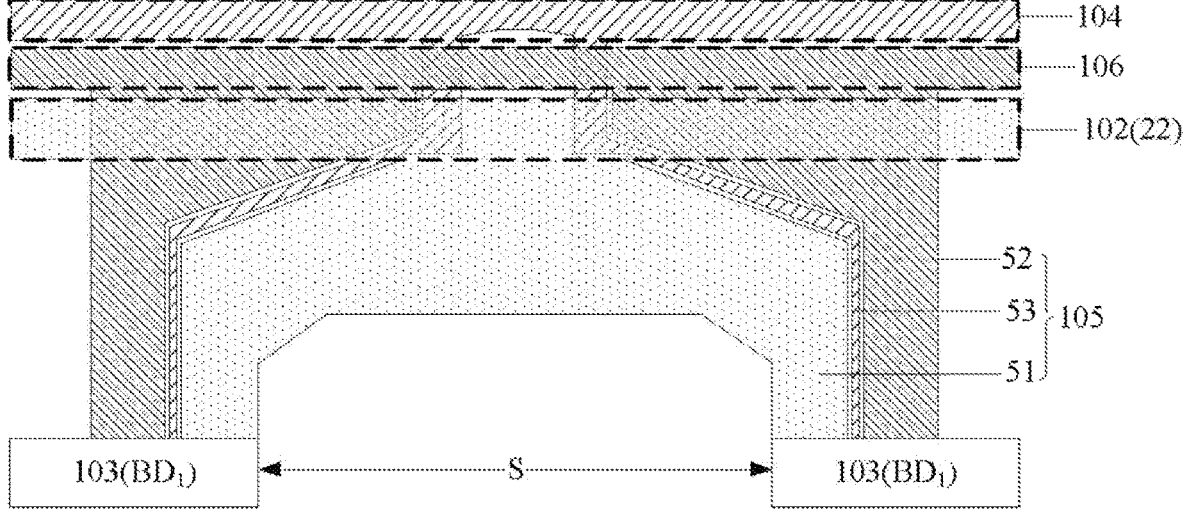
FIG. 2 is an enlarged schematic diagram of an M area in FIG. 1.

As can be seen from FIG. 2, in order to reduce the power consumption, each of the first lead 51, the second lead 52 and the third lead 53 has a relatively large line width, but the relatively large line width results in a small distance between adjacent leads. Since the first lead 51 is integrated with the first power bus 102, and the second lead 52 is integrated with the second power bus 106, the first lead 51 and the first power bus 102 transmit the same electrical signal, and the second lead 52 and the second power bus 106 transmit the same electrical signal. In the present disclosure, the first power bus 102 and the second power bus 106 are a low-level power bus and a high-level power bus respectively, which have a large voltage difference therebetween. That is, the first lead 51 and the second lead 52 have a large voltage difference therebetween. When the distance between the first lead 51 and the second lead 52 is small, there may be a risk that a high voltage will breakdown an insulation layer between the first lead 51 and the second lead 52 and cause short circuit between the first lead 51 and the second lead 52. Considering that a voltage value of the general reference line 104 is between a voltage value of the first power bus 102 and a voltage value of the second power bus 106, in the present disclosure, an orthographic projection of the third lead 53 (which transmits the same electrical signal as the general reference line 104) on the base substrate 101 is between an orthographic projection of the first lead 51 on the base substrate 101 and an orthographic projection of the second lead 52 on the base substrate 101, which can make the voltage difference between adjacent leads smaller, and thus can reduce the risk of short circuit caused by a large voltage difference.

In some embodiments, in the above display substrate provided by the embodiments of the present disclosure, as shown in FIG. 1, the first frame area $BB_1$ includes a plurality of first bonding areas $BD_1$ arranged abreast, and a spacing area S located between the first bonding areas $BD_1$. There are multiple lead groups 105. Each of the lead groups 105 is electrically connected to one end of the first circuit board 103 adjacent to the spacing area S. The lead groups 105 extend in a direction approaching the spacing area S. Since the wiring space in and around the spacing area S is larger, in order to reduce the power consumption, a lead group 105 having a large line width can be arranged in this wiring space, the lead group 105 is electrically connected to one end of the first circuit board 103 adjacent to the spacing area S, and the lead groups 105 extend in a direction approaching the spacing area S.

In some embodiments, in the above display substrate provided by the embodiments of the present disclosure, as shown in FIG. 1, a distance between the second lead 52 and the spacing area S, a distance between the third lead 53 and the spacing area S, and a distance between the first lead 51 and the spacing area S decrease in sequence. In other words, the first lead 51 is arranged close to the spacing area S, and the second lead 52 is arranged away from the spacing area S. In the present disclosure, the case where the first power bus 102 is a low-level power line is taken as an example for description. The low-level power line is generally electrically connected to a cathode of a light-emitting device. Optionally, the low-level power line is arranged in the same layer with the same material as a reflection-type anode, and is electrically connected to the cathode through a via hole penetrating through a pixel defining layer (PDL). In order to achieve a stable electrical connection effect, a large line width of the low-level power line should be ensured. In the present disclosure, when the first lead 51 is arranged close to the spacing area S, the spacing area S and the space on one side thereof close to the first power bus 102 can be fully utilized to lay the first lead 51 having a large line width (as shown in FIG. 2), so as to utilize an electrical connection between the first lead 51 and a cathode to achieve a stable connection between the first power bus 102 integrated with the first lead 51 and the cathode.

Figure 3:
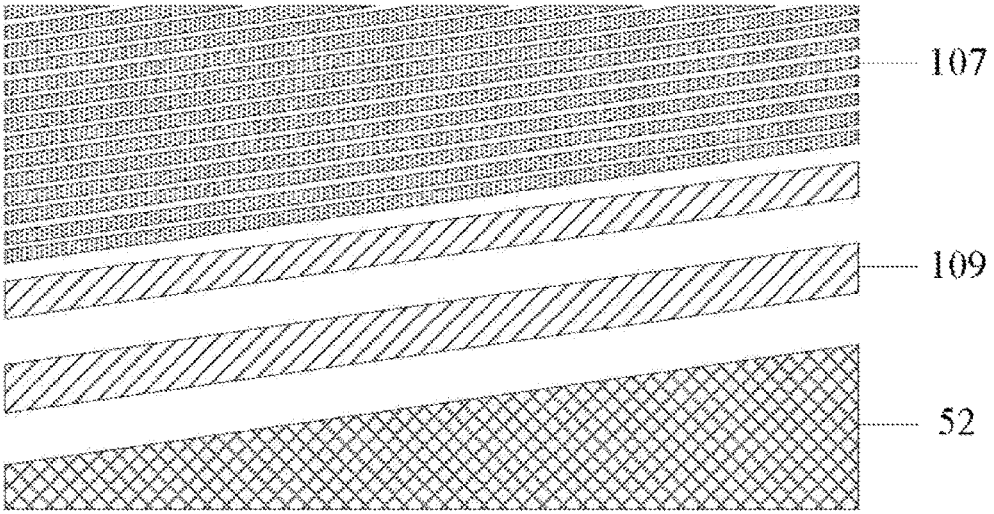
FIG. 3 is an enlarged schematic diagram of an N area in FIG. 1.

In some embodiments, the above display substrate provided by the embodiments of the present disclosure, as shown in FIG. 1 and FIG. 3, further includes a fan-out line 107 located in the first frame area $BB_1$. The fan-out line 107 is connected between the display area AA and the first circuit board 103. Optionally, one end of the fan-out line 107 is integrated with a data line 108 of the display area AA, and the other end of the fan-out line 107 is electrically connected to a middle portion of the first circuit board 103.

In some embodiments, the fan-out line 107 may be arranged in the same layer with the same material as the second lead 52. Optionally, the fan-out line 107 and the second lead 52 can be made of the material of the second source-drain metal layer ($SD_2$). In the present disclosure, "the same layer with the same material" refers to a layer structure formed in a single patterning process using the same mask, after forming a film layer for fabricating specific patterns using the same film-forming process. That is, a single patterning process corresponds to one mask (also called photomask). Depending on different specific patterns, the single patterning process may include multiple exposure, development or etching processes, the specific patterns in the formed layer structure may be continuous or discontinuous, and these specific patterns may be at the same height or have the same thickness, or may be at different heights or have different thicknesses. It can be seen that, when the fan-out line 107 is arranged in the same layer with the same material as the second lead 52, one mask process can be saved, the number of film layers can be decreased, and the production cost can be reduced.

In some embodiments, the above display substrate provided by the embodiments of the present disclosure, as shown in FIG. 3, further includes a plurality of floating lines 109 (i.e. no signal is loaded) that are arranged in the same layer with the same material as the fan-out line 107. The plurality of floating lines 109 are located between the fan-out line 107 and the second lead 52. When the mask has a sparse or no pattern design, a large area of photoresist will be developed, producing a high-density catalyst. When the mask has a dense pattern design, the development area of the photoresist will be smaller, producing a low-density catalyst. Due to the permeation effect, the catalyst density of a low-density area will gradually increase under the influence of the catalyst density of a high-density area, which affects the development process of the low-density area. As can be seen from FIG. 3, in the absence of the floating lines 109, patterns of the fan-out line 107 and the second lead 52 (corresponding to a pattern design area of the mask) are dense, and a blank area between the fan-out line 107 and the second lead 52 (corresponding to a pattern-free area of the mask) is large. During the development process, the catalyst density of this blank area will be greater than the catalyst densities of the area where the fan-out line 107 is located and the area where the second lead 52 is located. Due to the permeation effect, the catalyst densities of the area where the fan-out line 107 is located and the area where the second lead 52 is located will increase, causing over-development of the fan-out line 107 and the second lead wire 52. A thin fan-out line 107 may be broken after being over-developed. In the present disclosure, a plurality of floating lines 109 are provided between the fan-out line 107 and the second lead 52, making it possible to reduce the difference in catalyst density during the development process, and reduce the breakage probability of the fan-out line 107.

In some embodiments, in the above display substrate provided by the embodiments of the present disclosure, as shown in FIG. 3, in the direction from the fan-out line 107 to the second lead 52, line widths and line spaces of the floating lines 109 increase gradually, so that during the development process, in the direction from the fan-out line 107 to the second lead 52, the catalyst density has a gradually changing tend without causing an abrupt change in density, which can effectively improve the anti-breakage effect. Optionally, the minimum line width of the floating line 109 is greater than the line width of the fan-out line 107, and the maximum line width of the floating line 109 is less than the line width of the second lead 52.

In some embodiments, in the above display substrate provided by the embodiments of the present disclosure, as shown in FIG. 1, the base substrate 101 further includes a second frame area $BB_2$ arranged opposite to the first frame area $BB_1$, and a third frame area $BB_3$ and a fourth frame area $BB_4$ connected to the first frame area $BB_1$ and the second frame area $BB_2$ respectively. The second frame area $BB_2$ includes a second bonding area $BD_2$ for bonding the second circuit board 110. Optionally, the second circuit board 110 is a flexible circuit board (FPC). The first power bus 102 is provided in the first frame area $BB_1$, the second frame area $BB_2$, the third frame area $BB_3$ and the fourth frame area $BB_4$. The first power bus 102 in the second frame area $BB_2$ is electrically connected to the second circuit board 110. The first power bus 102 in the third frame area $BB_3$, and the first power bus 102 in the fourth frame area $BB_4$ are electrically connected to the first circuit board 103. The first power bus 102 in the second frame area $BB_2$, the third frame area $BB_3$ and the fourth frame area $BB_4$ are integrated. The display area AA of the display substrate includes a plurality of pixels arranged in an array. For example, FIG. 1 shows two pixels, each of which includes a red sub-pixel R, a green sub-pixel G and a blue sub-pixel B. Each sub-pixel includes a light-emitting device, and cathodes of the light-emitting devices are integrated to form a planar electrode. The planar electrode covers the frame area, and is electrically connected to the first power bus 102 in the frame area. By supplying power to the first power bus 102 within the first frame area $BB_1$ and the second frame area $BB_2$ respectively (i.e. two-side feeding), the voltage drop on the cathode can be reduced and the signal uniformity on the cathode can be improved, thereby facilitating uniform light emission of each light-emitting device and enhancing the uniformity of brightness. Since medium-sized and large-sized products have a relatively large voltage drop on the cathode, the two-side feeding solution of the present disclosure is particularly suitable for the medium-sized and large-sized products.

In some embodiments, in the above display substrate provided by the embodiments of the present disclosure, as shown in FIG. 1, the second power bus 106 can also be provided in the second frame area $BB_2$. The second power bus 106 is electrically connected to the second circuit 110. The display substrate further includes a power line 111 in the display area AA. One end of the power line 111 is electrically connected to the second power bus 106 in the first frame area $BB_1$, and the other end of the power line 111 is electrically connected to the second power bus 106 in the second frame area $BB_2$, so as to reduce the voltage drop on the power line 111, ensure that the amplitudes of power signals provided by the power line 111 to the pixel circuits contained in the sub-pixels in the same column are approximately the same, avoid the influence of the voltage drop on a working current provided by the pixel circuit to the light-emitting device, and enhance the uniformity of brightness.

In some embodiments, the above display substrate provided by the embodiments of the present disclosure, as shown in FIG. 1, further includes a plurality of fourth leads 112 and a plurality of fifth leads 113 in the second frame area $BB_2$. The plurality of fourth leads 112 are connected between the first power bus 102 and the second circuit board 110. The plurality of fifth leads 113 are connected between the second power bus 106 and the second circuit board 110. Orthographic projections of the fourth leads 112 on the base substrate 101 and orthographic projections of the fifth leads 113 on the base substrate 101 are arranged alternately. That is, an orthographic projection of the fourth lead 112 on the base substrate 101 does not overlap with an orthographic projection of the fifth lead 113 on the base substrate 101. Since the fourth lead 112 can be integrated with the first power bus 102 and the fifth lead 113 can be integrated with the second power bus 106, when the orthographic projection of the fourth lead 112 on the base substrate 101 does not overlap with the orthographic projection of the fifth lead 113 on the base substrate 101, the overlap capacitance between the first power bus 102 and the second power bus 106 is reduced, which can effectively prevent mutual interference of signals on the first power bus 102 and the second power bus 106.

In some embodiments, in the above display substrate provided by the embodiments of the present disclosure, as shown in FIG. 1, the third frame area $BB_3$ and/or the fourth frame area $BB_4$ include(s) a third bonding area $BD_3$ arranged abreast with the first frame area $BB_1$. The third bonding area $BD_3$ is used for bonding the third circuit board 114. Optionally, the third circuit board 114 is a flexible circuit board (FPC). In the third frame area $BB_3$ and/or the fourth frame area $BB_4$, the display substrate includes: a main line 115, a plurality of branch lines 116, and a plurality of shift registers 117 arranged in cascade. One end of each of the branch lines 116 is correspondingly electrically connected to one of the shift registers 117, and the other ends of all the branch lines 116 are connected to the third circuit board 114 through the main line 115. Some of the electrical signals (e.g. a low-voltage signal VGL, a high-voltage signal VGH, and a reset signal (Total reset)) required by the plurality of shift registers 117 are the same. In the present disclosure, an electrical signal (e.g. a low-voltage signal VGL) provided by the third circuit board 114 can be transmitted to a plurality of branch lines 116 through the main line 115, so that the electrical signal is divided into multiple electrical signals (i.e., one divided to multiple), and then transmitted to the corresponding shift registers 117 through the branch lines 116. In this way, the third circuit board 114 is prevented from providing the same electrical signal to the shift registers 117 through different pins respectively, thereby simplifying the structure of the circuit board 114, and facilitating the reduction of the cost.

In some embodiments, the above display substrate provided by the embodiments of the present disclosure, as shown in FIG. 1, may further include two sixth leads 118. The two sixth leads 118 each has one end integrated with a respective one of two ends of the general reference line 104, and the other end connected to an end of a respective one of the outermost two first circuit boards 103 away from the spacing area S in an arrangement direction of the first circuit boards 103 in the first bonding areas $BD_1$, so as to increase the connection path between the general reference line 104 and each of the first circuit boards 103, and ensure that the reference signals provided by the first circuit boards 103 can be transmitted to the general reference line 104 successfully. Optionally, all reference lines 119 of the display area AA are connected to the general reference line 104.

In some embodiments, as shown in FIG. 1, a plurality of auxiliary cathodes 120 extending longitudinally can also be provided in the display area AA of the display substrate. Each auxiliary cathode 120 can correspond to light-emitting devices within a column of sub-pixels. Moreover, the auxiliary cathode 120 is electrically connected to a cathode. The auxiliary cathode 120 can effectively lower the resistance of the cathode and reduce the voltage drop. Optionally, the auxiliary cathode 120 is located in a second source-drain metal layer $(SD_2)$. Optionally, as shown in FIG. 1, a plurality of initialization signal lines 121 can also be provided in the display area AA. Each initialization signal line 121 can initialize pixel circuits of a column of sub-pixels to release residual charges and ensure the normal work of the pixel circuits.

Figure 4:
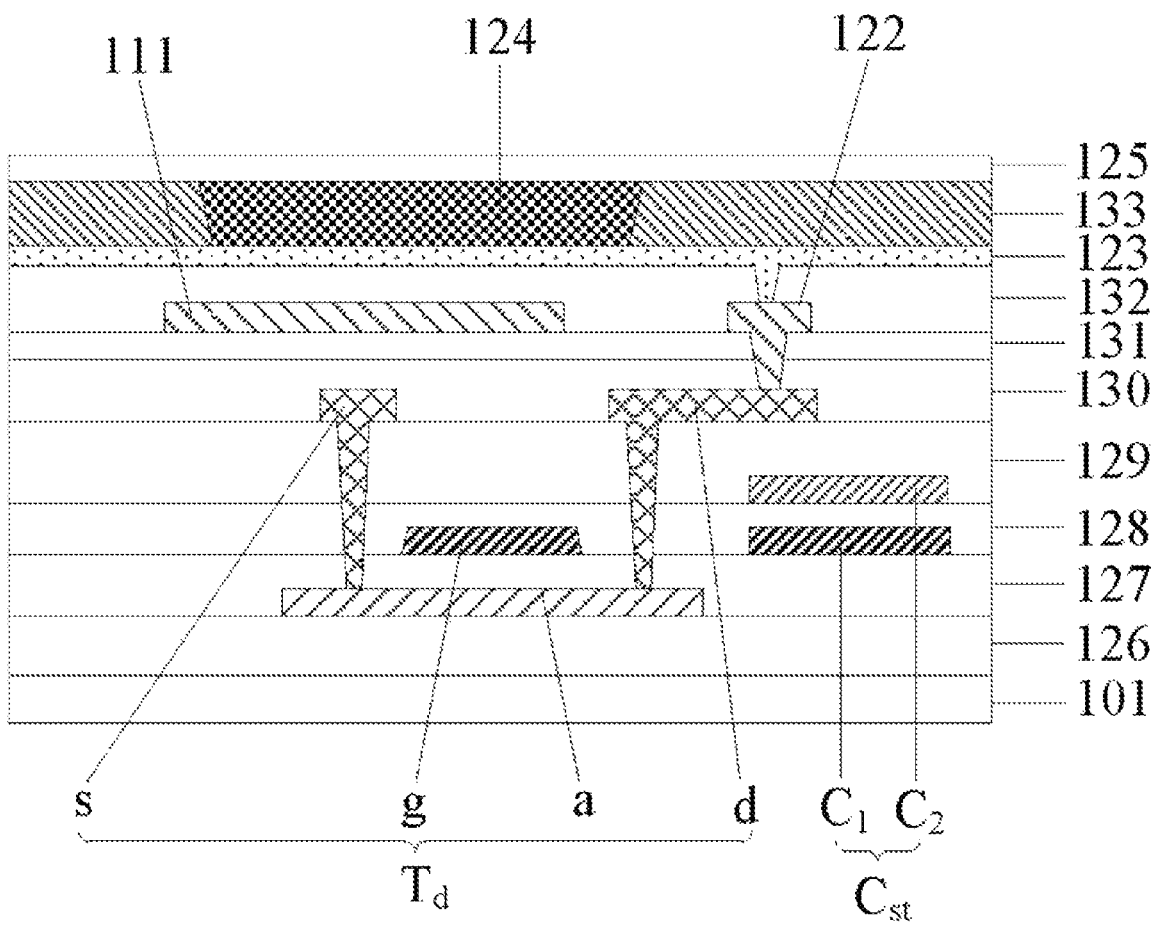
FIG. 4 is a schematic structural diagram of a sub-pixel provided by embodiments of the present disclosure.

In some embodiments, as shown in FIG. 4, the pixel circuit may include a driving transistor $T_d$, a storage capacitor $C_{st}$, etc.. A gate 'g' of the driving transistor $T_d$ is arranged in the same layer with the same material as a first electrode plate $C_1$ of the storage capacitor $C_{st}$. An active layer 'a' of the driving transistor $T_d$ is between a layer where the gate g is located (i.e. a first gate metal layer $GT_1$) and the base substrate 101. A layer where a second electrode plate $C_2$ of the storage capacitor $C_{st}$ is located (i.e. a second gate metal layer $GT_2$) is between a layer where a source 's'/drain 'd' of the driving transistor $T_d$ is located (i.e. a first source-drain metal layer $SD_1$) and a layer where the gate 'g' is located. The drain 'd' of the driving transistor $T_d$ may be electrically connected to an anode 123 of the light-emitting device through a transfer electrode 122 of a second source-drain metal layer $(SD_2)$. Optionally, the light-emitting device further includes a light-emitting functional layer 124 and a cathode 125. The light-emitting functional layer 124 includes, but does not limited to, a hole injection layer, a hole transport layer, an electron blocking layer, a light-emitting material layer, a hole blocking layer, an electron transport layer, and an electron injection layer. Optionally, the display substrate may further include a buffer layer 126, a first insulating layer 127, a second insulating layer 128, an interlayer dielectric layer 129, a first planarization layer 130, a third insulating layer 131, a second planarization layer 132 and a pixel defining layer 133, etc.. Those of ordinary skill in the art should understand that other components essential for the display substrate are also provided, which will not be elaborated here, and which should not be used to limit the present disclosure.

Optionally, a method for manufacturing the above display substrate provided by the embodiments of the present disclosure may include the following operations.

In the first operation, a buffer layer 126 is formed on the base substrate 101. Optionally, the base substrate 101 may be Corning or Asahi glass, or quartz glass, or the like having a thickness of 50 μm to 1000 μm. The buffer layer 126 may be a single-layer or stacked-layer structure. The material of the buffer layer 126 may include silicon oxide $(SiO_x)$, silicon nitride $(SiN_x)$, silicon oxynitride $(SiO_xN_y)$, etc., and the thickness of the buffer layer 126 may be 150 μm to 500 μm.

In the second operation, an amorphous silicon film having a thickness of 20 nm to 100 nm is formed on the buffer layer 126, and is transformed into a polycrystalline silicon film using a laser crystallization method, and an active layer 'a' made of polysilicon is formed by patterning. Optionally, the active layer 'a' may be an active layer of each transistor in the pixel circuit or the shift register 117.

In the third operation, a first insulating layer 127 is formed on the active layer 'a'. The first insulating layer 127 may be a single-layer or stacked-layer structure. The material of the first insulating layer 127 may include silicon oxide $(SiO_x)$, silicon nitride $(SiN_x)$, silicon oxynitride $(SiO_xN_y)$, etc., and the thickness of the first insulating layer 127 may be 100 nm to 200 nm.

In the fourth operation, a first gate metal film is formed on the first insulating layer 127, and a first gate metal layer $GT_1$ is formed after patterning the first gate metal film. The first gate metal layer $GT_1$ includes a gate 'g' and a first electrode plate $C_1$. Optionally, the gate 'g' may be a gate of each transistor in the pixel circuit or the shift register 117.

In the fifth operation, a second insulating layer 128 is formed on the first gate metal layer $GT_1$. The second insulating layer 128 may be a single-layer or stacked-layer structure. The material of the second insulating layer 128 may include silicon oxide $(SiO_x)$, silicon nitride $(SiN_x)$, silicon oxynitride $(SiO_xN_y)$, etc., and the thickness of the second insulating layer 128 may be 100 nm to 200 nm.

In the sixth operation, a second gate metal film 128 is formed on the second insulating layer 128, and a second gate metal layer $GT_2$ is formed after patterning the second gate metal film. The second gate metal layer $GT_2$ includes a second electrode plate $C_2$ and an initialization signal line 121.

In the seventh operation, an interlayer dielectric layer 129 having a via hole is formed on the second gate metal layer $GT_2$. During the process of forming the interlayer dielectric layer 129, via holes in communication with the via hole in the interlayer dielectric layer 129 can also be formed in the first insulating layer 127 and the second insulating layer 128, so that a source 's'/drain 'd' formed subsequently is connected with the active layer 'a' through the via hole that penetrate through the first insulating layer 127, the second insulating layer 128 and the interlayer dielectric layer 129. Further, via holes connecting the source 's'/drain 'd' to the gate 'g' of the first gate metal layer $GT_1$ and to the second electrode plate $C_2$ of the second gate metal layer $GT_2$ can also be obtained. Optionally, the interlayer dielectric layer 129 may be a single-layer or stacked-layer structure. The material of the interlayer dielectric layer 129 include silicon oxide $(SiO_x)$, silicon nitride $(SiN_x)$, silicon oxynitride $(SiO_xN_y)$, etc.

In the eighth operation, a first source-drain metal film is formed on the interlayer dielectric layer 129, and a first source-drain metal layer $SD_1$ is formed after patterning the first source-drain metal film. The first source-drain metal layer $SD_1$ includes a source 's', a drain 'd', a reference line 119, a general reference line 104, a third lead 53, a sixth lead 118, a main line 115, a branch line 116, and a transverse signal line including a gate line. Optionally, the material of the first source-drain metal layer $SD_1$ may be aluminum (Al), molybdenum (Mo), chromium (Cr), copper (Cu), titanium (Ti), etc., with a thickness of 200 nm to 1000 nm. The first source-drain metal layer $SD_1$ may be a stacked-layer structure consisting of a titanium metal layer/an aluminum metal layer/an titanium metal layer. Optionally, the source 's' or the drain 'd' may be a gate of each transistor in the pixel circuit or the shift register 117.

In the ninth operation, after a first planarization layer 129 having a thickness of 1.5 μm to 3 μm is formed on the first source-drain metal layer $SD_1$, a third insulating layer 130 is formed on the first planarization layer 129. A via hole for connecting a transfer electrode 122 and the drain 'd' of the driving transistor $T_d$ is provided in the first planarization layer 129 and the third insulating layer 130. Optionally, the third insulating layer 130 may be a single-layer or stacked-layer structure, and the material of the third insulating layer 130 may include silicon oxide $(SiO_x)$, silicon nitride $(SiN_x)$, silicon oxynitride $(SiO_xN_y)$, etc.

In the tenth operation, a second source-drain metal film is formed on the third insulating layer 130, and a second source-drain metal layer $SD_2$ is formed after patterning the second source-drain metal film. The second source-drain metal layer $SD_2$ includes a transfer electrode 122, a second power bus 106, a second lead 52 integrated with the second power bus 106, a fifth lead 113, a floating line 109, an auxiliary electrode 120, a fan-out line 107, and longitudinal signal lines such as a data line 108 and a power line 111. Optionally, the material of the second source-drain metal layer $SD_2$ may be aluminum (Al), molybdenum (Mo), chromium (Cr), copper (Cu), titanium (Ti), etc., with a thickness of 200 nm to 1000 nm. The second source-drain metal layer $SD_2$ may be a stacked-layer structure consisting of a titanium metal layer/an aluminum metal layer/a titanium metal layer.

In the eleventh operation, a second planarization layer 132 having a thickness of 1.5 μm to 3 μm is formed on the second source-drain metal layer $SD_2$. The second planarization layer 132 includes a via hole for connecting the transfer electrode 122 and an anode 123.

In the twelfth operation, an anode 123 of a light-emitting device is formed on the second planarization layer. The anode 123 may be a reflection-type anode. The material of the anode 123 may include aluminum (Al), molybdenum (Mo), copper (Cu), silver (Ag) and indium tin oxide (ITO), etc.. For example, the anode 123 has a three-layer structure consisting of an indium tin oxide layer/a silver metal layer/an indium tin oxide layer, and the thickness of the anode 123 is 70 nm to 200 nm. Optionally, while forming the anode 123, the first power bus 102, the first lead 51, and the fourth lead 112 may be formed.

In the thirteenth operation, a pixel defining layer 133 with a pixel opening is formed on a layer where the anode 123 is located. The pixel opening exposes the anode 123. The pixel defining layer 133 also has a via hole that connects the first power bus 102 and a cathode 125 formed subsequently. Optionally, the thickness of the pixel defining layer 133 is 1.5 μm to 2.0 μm.

In the fourteenth operation, a light-emitting functional layer 124 is formed at the pixel opening. The light-emitting functional layer 124 includes, but does not limited to, a hole injection layer, a hole transport layer, an electron blocking layer, a light-emitting material layer, a hole blocking layer, an electron transport layer, and an electron injection layer.

In the fifteenth operation, a cathode 125 is formed on the entire surface of the light-emitting functional layer 124. The cathode is electrically connected to the first power bus 102.

Based on the same inventive concept, embodiments of the present disclosure provide a display device, including the above display substrate provided by the embodiments of the present disclosure. Since the principle of the display device for solving the problem is similar to the principle of the above display substrate for solving the problem, for the implementation of the display device provided by the embodiments of the present disclosure, reference may be made to the implementation of the above display substrate provided by the embodiments of the present disclosure, which will not be repeated herein.

In some embodiments, the above display device provided by the embodiments of the present disclosure may be: a mobile phone, a tablet computer, a television, a display, a notebook computer, a digital photo frame, a navigator, a smart watch, a fitness wristband, a personal digital assistant, or any other products or components that have display function.

Moreover, the above display device provided by the embodiments of the present disclosure may include, but is not limited to: a radio frequency unit, a network module, an audio output & input unit, a sensor, a display unit, a user input unit, an interface unit, a control chip, and other components. Optionally, the control chip is a central processing unit, a digital signal processor, a System on Chip (SoC), etc. For example, the control chip may also include a memory, may also include a power module and the like, and realize power supply and signal input and output functions through additional wires, signal lines and the like. For example, the control chip may also include a hardware circuit, computer executable codes and the like. The hardware circuit may include a conventional Very Large Scale Integration (VLSI) circuit or gate array, as well as an existing semiconductor like a logic chip or a transistor, or other discrete components. The hardware circuit may also include a field programmable gate array, a programmable array logic, a programmable logic device and the like. In addition, those skilled in the art can understand that, the above structures do not constitute limitations on the above display device provided by the embodiments of the present disclosure. In other words, the above display device provided by the embodiments of the present disclosure may include more or less of the above components, or combinations of certain components, or different arrangements of the components.

While preferred embodiments of the present disclosure have been described, it should be understood that, those skilled in the art can make various modifications and variations to the embodiments of the present disclosure without departing from the spirit and scope of the embodiments of the present disclosure. In this way, if the modifications and variations of the embodiments of the present disclosure fall within the scope of the claims of the present disclosure and equivalent technologies, the present disclosure also intends to include these modifications and variations.

What is claimed is:

1. A display substrate, comprising:
a base substrate, including a display area, and a first frame area on one side of the display area;
a first power bus at least in the first frame area; and
a second power bus at least in the first frame area;
wherein the first power bus comprises:
    a first sub-bus,
    a second sub-bus, and
    at least two connecting wires,
    wherein the first sub-bus is between the second sub-bus and the display area, and the first sub-bus is electrically connected to the second sub-bus through the at least two connecting wires;
    in the first frame area, an orthographic projection of the second power bus on the base substrate is between an orthographic projection of the first sub-bus on the base substrate and an orthographic projection of the second sub-bus on the base substrate.

2. The display substrate according to claim 1, wherein the first frame area comprises at least one first bonding area for bonding a first circuit board;
the display substrate further comprises:
    a general reference line and at least one lead group in the first frame area,
    wherein the lead group is electrically connected to the first circuit board, and the lead group comprises:
    a first lead,
    a second lead, and
    a third lead,
    wherein the first lead is integrated with the first power bus, the second lead is integrated with the second power bus, the third lead is integrated with the general reference line, and an orthographic projection of the third lead on the base substrate is between an orthographic projection of the first lead on the base substrate and an orthographic projection of the second lead on the base substrate.

3. The display substrate according to claim 2, wherein the first frame area comprises the at least one first bonding area comprising a plurality of bonding areas arranged abreast, and a spacing area between the first bonding areas;
    the at least one lead group comprises a plurality of lead groups, each of the lead groups is electrically connected to one end of the first circuit board adjacent to the spacing area, and the lead group extends in a direction approaching the spacing area.

4. The display substrate according to claim 3, wherein a distance between the second lead and the spacing area, a distance between the third lead and the spacing area, and a distance between the first lead and the spacing area decrease in sequence.

5. The display substrate according to claim 4, further comprising:
    a fan-out line in the first frame area,
    wherein the fan-out line is connected between the display area and the first circuit board, and the fan-out line is arranged in a same layer with a same material as the second lead.

6. The display substrate according to claim 5, further comprising:
    a plurality of floating lines arranged in the same layer with the same material as the fan-out line;
    wherein the plurality of floating lines are between the fan-out line and the second lead.

7. The display substrate according to claim 6, wherein in a direction from the fan-out line to the second lead, line widths and line spaces of the floating lines increase gradually.

8. The display substrate according to claim 3, wherein the base substrate further comprises a second frame area arranged opposite to the first frame area, and a third frame area and a fourth frame area connected to the first frame area and the second frame area respectively; the second frame area comprises a second bonding area for bonding a second circuit board;
    the first power bus is provided in the first frame area, the second frame area, the third frame area and the fourth frame area, the first power bus in the second frame area is electrically connected to the second circuit board, the first power bus in the third frame area and the first power bus in the fourth frame area are electrically connected to the first circuit board, and the first power bus in the second frame area, the third frame area and the fourth frame area is integrated.

9. The display substrate according to claim 8, wherein the second power bus is further provided in the second frame area and is electrically connected to the second circuit board;
    the display substrate further comprises:
    a power line in the display area,
    wherein one end of the power line is electrically connected to the second power bus in the first frame area, and the other end of the power line is electrically connected to the second power bus in the second frame area.

10. The display substrate according to claim 9, further comprising:
    a plurality of fourth leads and a plurality of fifth leads in the second frame area,
    wherein the plurality of fourth leads are connected between the first power bus and the second circuit board, the plurality of fifth leads are connected between the second power bus and the second circuit board, and orthographic projections of the fourth leads on the base substrate and orthographic projections of the fifth leads on the base substrate are arranged alternately.

11. The display substrate according to claim 8, wherein the third frame area and/or the fourth frame area comprises a third bonding area arranged abreast with the first frame area, wherein the third bonding area is for bonding a third circuit board;
    in the third frame area and/or the fourth frame area, the display substrate comprises:
    a main line,
    a plurality of branch lines, and
    a plurality of shift registers arranged in cascade, wherein one end of each of the branch lines is electrically connected to a corresponding one of the shift registers, and the other ends of all the branch lines are connected to the third circuit board through the main line.

12. The display substrate according to claim 3, further comprising:

two sixth leads, wherein the two sixth leads each has one end integrated with a respective one of two ends of the general reference line, and the other end connected to an end of a respective one of the outermost two first circuit boards away from the spacing area in an arrangement direction of the first bonding areas.

13. The display substrate according to claim 2, wherein in a direction away from the display area, the first sub-bus, the general reference line, the second power bus, and the second sub-bus are arranged in sequence.

14. The display substrate according to claim 2, wherein a layer where the second power bus is located is between a layer where the general reference line is located and a layer where the first power bus is located.

15. A display device, comprising a display substrate according to claim 1.

* * * * *